(12) United States Patent
Park et al.

(10) Patent No.: US 6,621,109 B1
(45) Date of Patent: Sep. 16, 2003

(54) CHARGE COUPLED DEVICE WITH SPLIT CHANNELED HCCD

(75) Inventors: Yong Park, Kyonggi-do (KR); Seo Kyu Lee, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 88 days.

(21) Appl. No.: 09/639,230

(22) Filed: Aug. 16, 2000

(30) Foreign Application Priority Data

Aug. 17, 1999 (KR) .............................. 99-33979

(51) Int. Cl.$^7$ .................................. H01L 27/148
(52) U.S. Cl. .................... 257/223; 257/232; 257/234; 257/241
(58) Field of Search .............. 257/45, 224, 231–234, 257/241–243, 223, 249; 377/63

(56) References Cited

U.S. PATENT DOCUMENTS

| | | | | |
|---|---|---|---|---|
| 5,627,388 A | * | 5/1997 | Shinji ........................ | 257/223 |
| 5,650,644 A | * | 7/1997 | Funakoshi et al. ........... | 257/240 |
| 5,742,081 A | * | 4/1998 | Furumiya .................... | 257/232 |
| 6,441,409 B1 | * | 8/2002 | Kim ............................ | 257/232 |

FOREIGN PATENT DOCUMENTS

JP            04167470 A   *  6/1992   .................. 257/227

* cited by examiner

*Primary Examiner*—Minh Loan Tran
*Assistant Examiner*—Thomas L Dickey
(74) *Attorney, Agent, or Firm*—Morgan, Lewis & Bockius LLP

(57) ABSTRACT

A charge coupled device includes a plurality of photoelectric conversion regions; a plurality of vertical charge coupled devices (VCCDs) provided between the photoelectric conversion regions for transmission of charges generated at the photoelectric conversion regions in a first direction; and a horizontal charge coupled device (HCCD) coupled to the VCCDs and having a channel region including a plurality of channels for transmission of the charges previously transmitted through the VCCDs in a second direction. The channel region is formed such that one of the plurality of channels has a higher potential than the remaining channels. The remaining channels have potentials that gradually become lower than the highest potential moving in a direction away from the channel with the highest potential. The channel region transmits the charges within the HCCD so that the charges are gathered together centered around the channel having the highest potential during transmission of the charges.

11 Claims, 7 Drawing Sheets

CHARGE COUPLED DEVICE WITH SPLIT CHANNELED HCCD

This application claims the benefit of Korean Patent Application No. P1999-33979, filed in Korea on Aug. 17, 1999, which is hereby incorporated by reference.

BACKGROUND OF THE INVENTION

1. Field of the Invention

The present invention relates to a charge coupled device, and more particularly, to a charge coupled device having a charge transmission portion that is divided into a plurality of regions, each of these regions having a respective voltage difference, for improving a charge transmission efficiency of the device.

2. Discussion of the Related Art

A related art charge coupled device will be explained with reference to the attached drawings. FIG. 1 illustrates a plan view of a related art solid state image sensor, and FIG. 2 illustrates a plan view of a related art horizontal charge coupled device.

Referring to FIG. 1, an image sensor arrangement is illustrated including a charge coupled device for converting a signal of light into an electrical signal. The image sensor arrangement includes a plurality of photoelectric conversion regions 11 for effectuating photo-electric conversion and accumulation of generated charges. The photoelectric conversion regions, are preferably photodiode regions. The image sensor arrangement also includes a charge transmission channel comprised of Vertical Charge Coupled Devices (VCCDs) 12a and a Horizontal Charge Coupled Device (HCCD) 12b for transmission of signal charges generated in the photodiode regions 11. The image sensor arrangement also includes a sense amplifier 13 for sensing the signal charge transmitted through the charge transmission channel. The charge transmission channel is provided with the VCCDs 12a for transmission, in a vertical direction, of charges generated in a plurality of photodiode regions 11. The HCCD 12b is provided coupled to the VCCDs for transmission of the charges that were transmitted in the vertical direction in the VCCDs in a horizontal direction.

Referring to FIG. 2, the HCCD portion of the charge transmission channel is provided with a channel region 21 formed by implanting ions, such as 'As', in a 'p' type well formed in a surface of a semiconductor substrate. A plurality of gate electrodes 22 are formed on the channel region 21 separated from each other in sequence, as illustrated at least in FIG. 2, for transmission of charges.

The charge transmission of the foregoing charge transmission channel is formed in the following way. FIGS. 3A and 3B illustrate sections across lines A–A' and B–B' in FIG. 2. The channel region 21 has a uniform concentration as well as a uniform potential distribution in a state where no clock signal is provided to the gate electrodes 22. The HCCD is formed by implanting 'p' type impurity ions in the semiconductor substrate N-SUB uniformly, to form a 'p' type well, and implanting 'n' type impurities in the 'p' type well region uniformly. When clock signals having supply level differences are provided to the gate electrodes 22 on the HCCD of the charge coupled device, potential differences are caused by these supply level differences.

These potential differences cause the charges to move in one direction within the HCCD. In this instance, the charge signal moves through the channel region 21 of the HCCD distributed uniformly throughout the entire channel region 21 regardless of the intensity of the charge signal. Since the HCCD should preferably receive and read all the charges transmitted from the VCCDs within a short time period, the HCCD operates using two phase clocking while the VCCDs operate using four phase clocking. While this related art CCD performs relatively efficiently when the amount of charge moving through the channel region is large, its performance decreases significantly when the amount of charge moving through the channel region is small. There are at least three reasons for this.

First, the movement of charges distributed throughout the channel region 21 under the gate electrodes 22 may cause a small charge amount to be lost due to a defective channel region. Secondly, when a small charge amount moves through the relatively wide channel region of the HCCD, the potential of the charge may not be sustained, and may be lost as a result of the voltage applied to the gate electrodes. Third, while a narrow channel region is favorable for a high charge transmission efficiency for reasons discussed above, the width of the HCCD needs to wide enough to be compatible with a possible maximum charge amount However, such a width can drop the charge transmission efficiency of the HCCD when small charges are transmitted, as discussed above.

SUMMARY OF THE INVENTION

Accordingly, the present invention is directed to a charge coupled device that substantially obviates one or more of the problems due to limitations and disadvantages of the related art.

An object of the present invention is to provide a charge coupled device which has a high charge transmission efficiency, with either a large or small amount of transmitted charges.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the charge coupled device includes a plurality of photoelectric conversion regions; a plurality of vertical charge coupled devices (VCCDs) provided between the photoelectric conversion regions for transmission of charges generated at the photoelectric conversion regions in a first direction; and a horizontal charge coupled device (HCCD) coupled to the VCCDs and having a channel region including a plurality of channels for transmission of the charges previously transmitted through the VCCDs in a second direction. The channel region is formed such that one of the plurality of channels has a higher potential than the remaining channels. The remaining channels have potentials that gradually become lower than the highest potential moving in a direction away from the channel with the highest potential. The channel region transmits the charges within the HCCD so that the charges are gathered together centered around the channel having the highest potential during transmission of the charges.

In another aspect, a charge coupled device includes a semiconductor substrate; photoelectric conversion regions formed in a well region in a surface of the semiconductor substrate; vertical charge coupled devices (VCCDS) for transmission of charges generated at the photoelectric conversion regions in a first direction; and a horizontal charge coupled device (HCCD) for transmission of the charges previously transmitted through the VCCDS in a second direction. The HCCD is formed in a well region that is separated into a plurality of split portions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
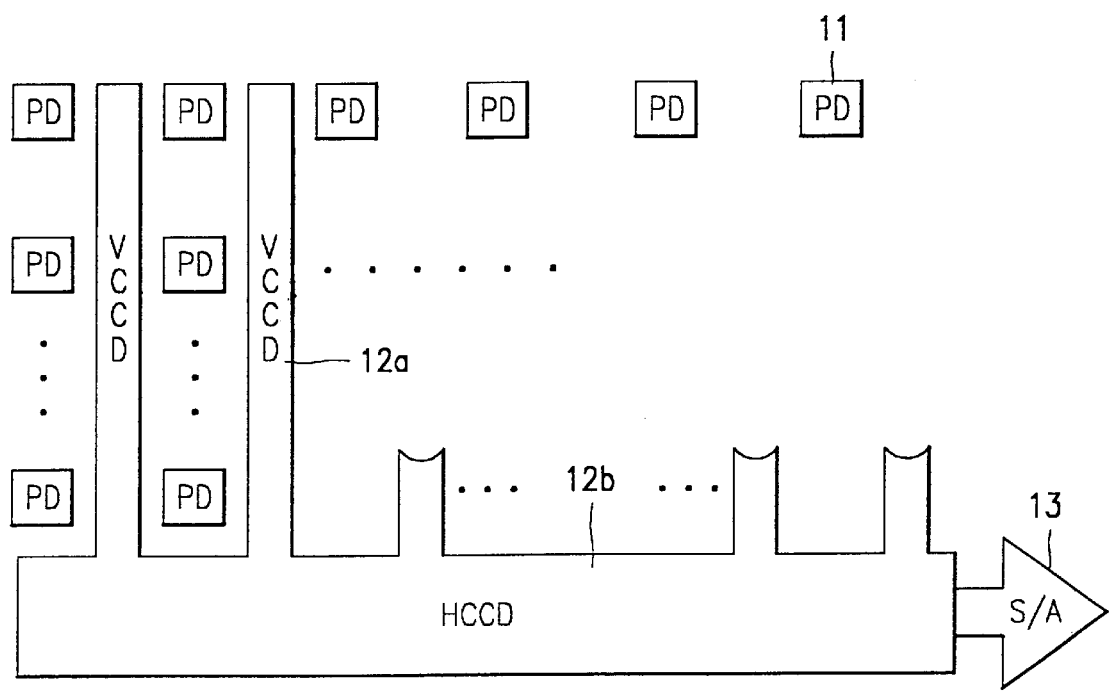
FIG. 1 illustrates a plan view of a related art solid state image sensor.
Figure 2:
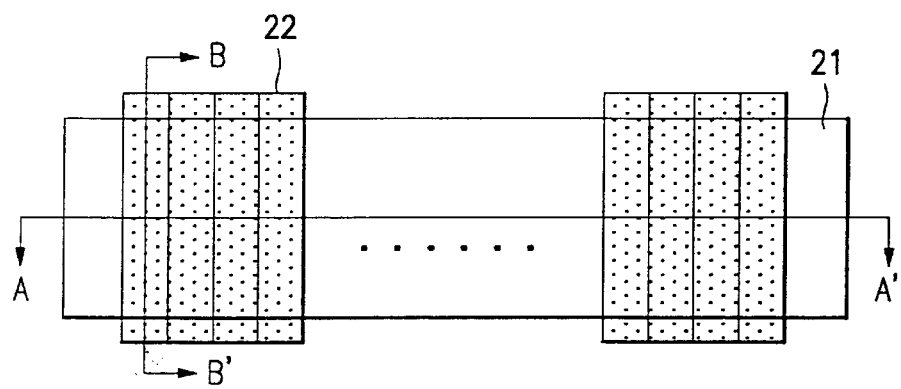
FIG. 2 illustrates plan view of a related art horizontal charge coupled device.
Figure 3A:
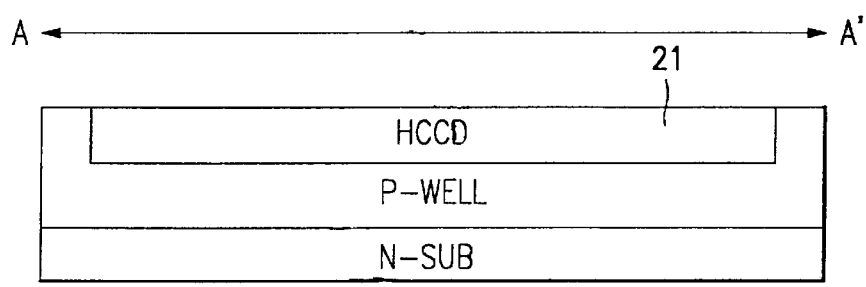
FIGS 3A and 3B illustrate sections across lines A—A' and B—B' in FIG. 2, respectively.
Figure 3B:
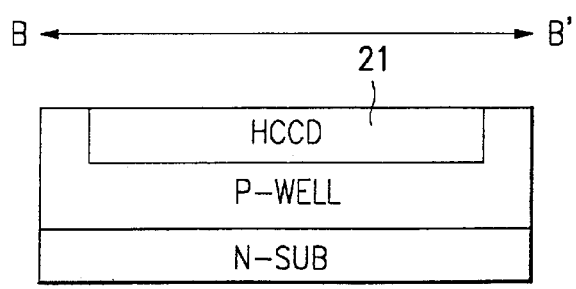
Figure 4:
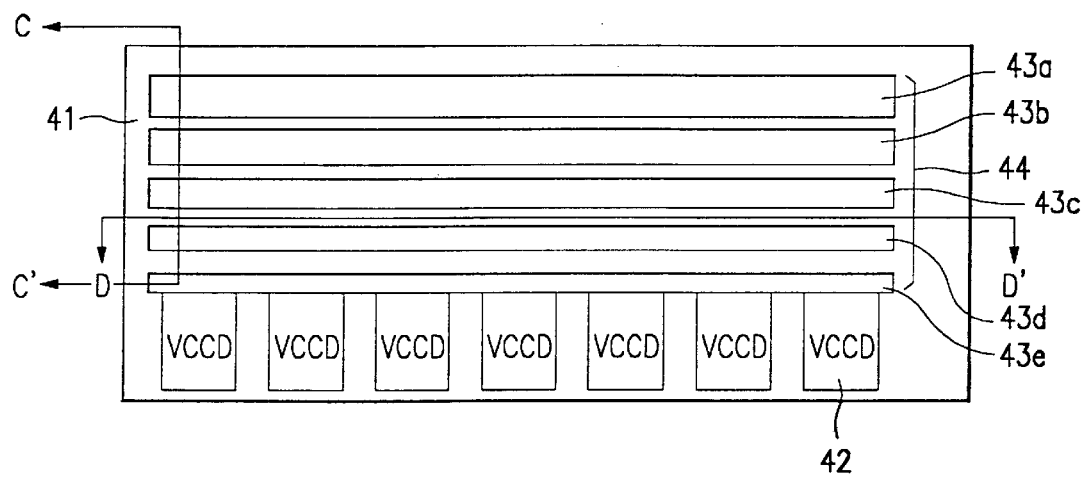
FIG. 4 illustrates a plan view after a 'p' well region is formed in an HCCD in accordance with a preferred embodiment of the present invention.
Figure 5A:
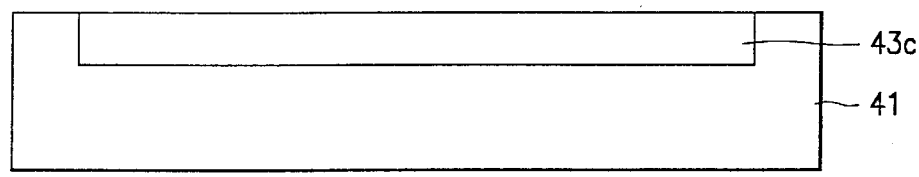
FIGS. 5A and 5B illustrate sections across lines C–C' and D–D' in FIG. 4, respectively.
Figure 5B:
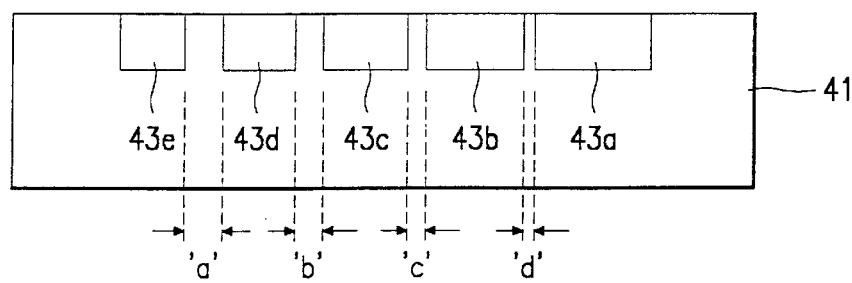

FIG. 4 illustrates a plan view after a 'p' well region is formed in an HCCD 44 in accordance with a preferred embodiment of the present invention. FIGS. 5A and 5B illustrate sections across lines C–C' and D–D' in FIG. 4, respectively.

The present invention involves the formation of a well region in a semiconductor substrate 41. Instead of forming the well region to cover the entire substrate on which the HCCD is to be formed, the instant invention forms the well region to include a plurality of split portions 43a, 43b, 43c, 43d, and 43e, as illustrated, for example, in FIG. 4. This split well region formation results in an improved charge transmission efficiency of the HCCD. The split portions of the well region can each differ in their respective widths and the distances between the split portions within the well region can also differ. The formation of the split well region in this way results in the HCCD having particular potential differences being generated that vary based on the particular distances between split portions of the well region as well as from the differences between the respective widths of each of the split portions of the well region.

As illustrated in FIG. 4, the split portions 43a, 43b, 43c, 43d, and 43e of the well region are formed in a surface of the semiconductor substrate 41. An HCCD 44 of the instant invention is formed from this arrangement by arranging the split portions of the well region in particular ways. For example, the split portions may be arranged with the widest portion being provided at a particular side of the semiconductor substrate 41. This may be a first side adjacent to the VCCDs 42 in FIG. 4, or a second side opposite to the first side.

As shown in FIG. 5A, a depth of the well region is preferably provided in a uniform fashion. As shown in FIG. 5B, the widths of the split portions of the 'p' type well may be provided in an order of $43a > 43b > 43c > 43d > 43e$. Moreover, the distances between the split portions of the 'p' type well may be provided in an order of 'a'>'b'>'c'>'d'.

In general, a 'p' type well region within the VCCDs is formed therein without separate split portions. On the other hand, within the HCCD 44, the distances between the split portions of the 'p' type well region may be arranged so that the narrowest distance is between two split portions (e.g., 43d and 43e) located adjacent to the VCCD's 42 or between two split portions (e.g., 43a and 43b) at the opposite side, not adjacent to the VCCD's. Alternatively, the narrowest distance may be provided between two split portions (e.g., 43b and 43c) more towards the center portion of the well region.

Moreover, the respective widths of the split portions of the 'p' type well region may be arranged so that the widest split portion is provided at the side of the well region adjacent to the VCCDs, at the center split portion, or at the opposite side of the well region not adjacent to the VCCDs. The split portions may be arranged with a center split portion being the widest, with the rest of the split portions progressively getting smaller moving further from the center split portion.

The distances between the spit portions of the 'p' type well region may be made equal with only the widths of the split portions of the 'p' type well region being varied. Alternatively, the widths of the split portions of the 'p' type well region may be made equal while the distances between the spit portions of the 'p' type well region may be varied. Accordingly, the well region is provided with split portions, with the distances between the split portions and the widths of the split portions themselves being varied. These changes provide control of potential differences within the HCCD such that a highest potential level may be directed to a particular portion of the HCCD. The portion with the highest potential may be set up with reference to a floating diffusion region. Depending on the distances between the split portions of the 'p' type well region, as well as the respective widths of the split portions of the 'p' type well region, a potential of the HCCD may be provided in a stair profile form in a direction vertical to the charge transmission direction, or in a separated potential well form. FIGS. 10B, 11A and 11B respectively illustrate potentials profiles which form no pockets in respective split portions. FIG. 11C illustrates a potential profile which forms pockets in respective split portions.

Figure 6:
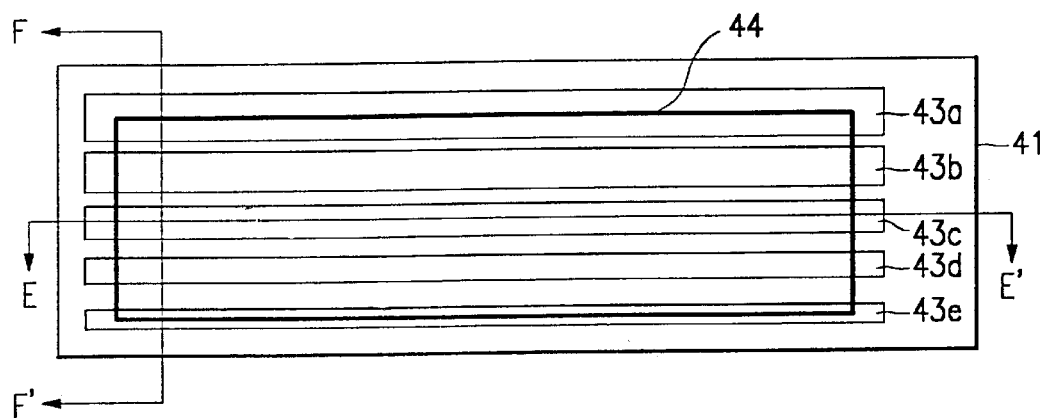
FIG. 6 illustrates a plan view after a channel region is formed in an HCCD in accordance with a preferred embodiment of the present invention.
Figure 7A:
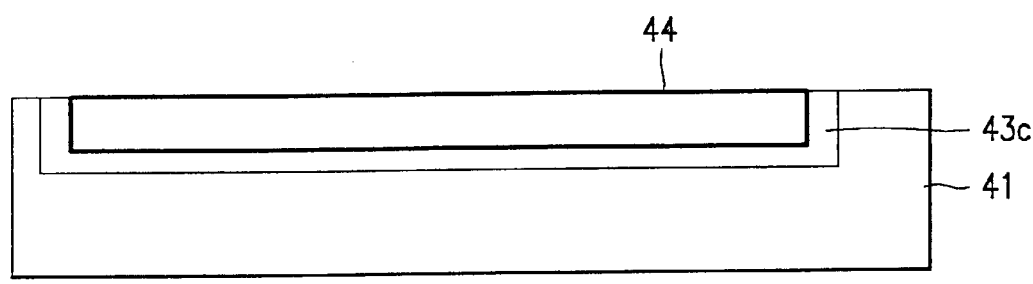
FIGS. 7 and 7B illustrate sections across lines E–E' and F–F' in FIG. 6, respectively.
Figure 7B:
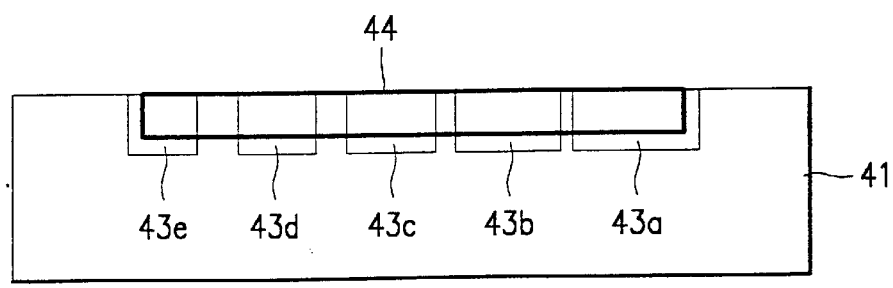

A fabrication process that occurs after the 'p' type well region is formed will be now explained. FIG. 6 illustrates a plan view after a channel region is formed in an HCCD in accordance with a preferred embodiment of the present invention. FIGS. 7A and 7B illustrate sections across lines E–E' and F–F' in FIG. 6, respectively.

As shown in FIG. 6, after the well region is formed as discussed above, an HCCD is ultimately formed therein using a mask and an ion injection process in which 'n' type impurity ions are implanted, to form the HCCD 44. Though not shown in FIG. 6, VCCDs (42 in FIG. 4) are also formed at the same time. As shown in FIGS. 7A and 7B, the HCCD 44 has a uniform depth and concentration. However, the HCCD 44 has an actual potential level that is varied with location along the HCCD 44 depending on the arrangement of the split portions of the 'p' type well region 43a, 43b, 43c, 43d, and 43e. For example, the HCCD potential varies depending on whether the split portions are distanced equally or unequally, and whether they have widths different from one another. This is followed by the formation of gate electrodes.

Figure 8:
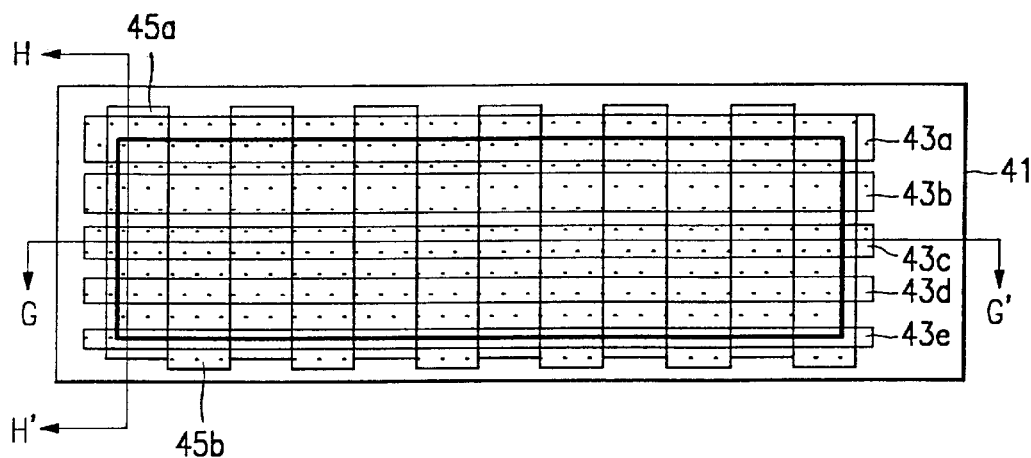
FIG. 8 illustrates a plan view after a channel gate electrode is formed in an HCCD in accordance with a preferred embodiment of the present invention.
Figure 9A:
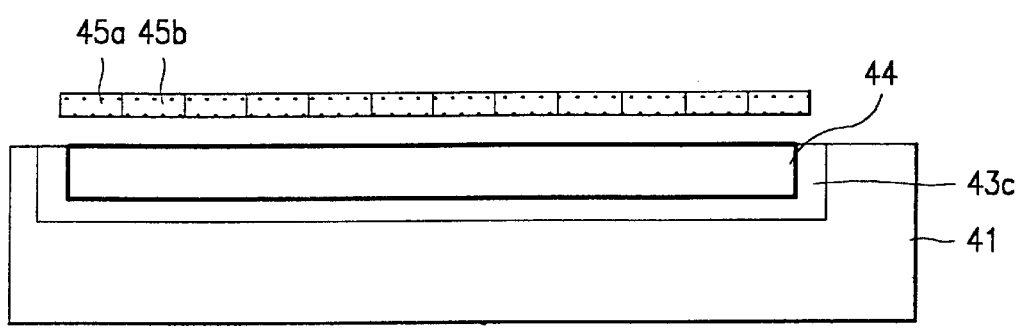
FIGS. 9A and 9B illustrate sections across lines G–G' and H—H' in FIG. 8, respectively.
Figure 9B:
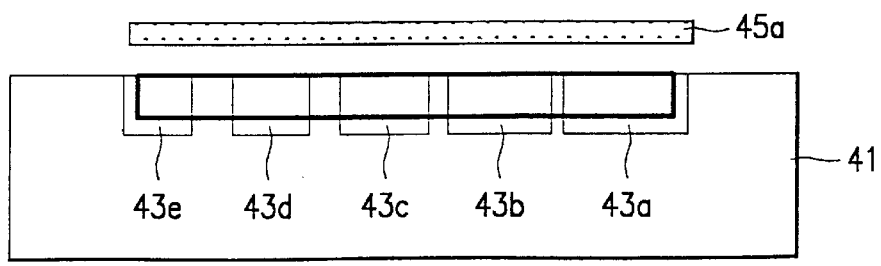

FIG. 8 illustrates a plan view after a channel gate electrode is formed in an HCCD in accordance with a preferred embodiment of the present invention. FIGS. 9A and 9B illustrate sections across lines G–G' and H–H' in FIG. 8, respectively. After the HCCD 44 is formed as discussed above, the gate electrodes 45a and 45b for transmission of charges are formed thereon. The gate electrodes 45a and 45b are electrically insulated from each other, portions of the gate electrodes are overlapped, and the gate electrodes 45a and 45b are formed repetitively in sequence, as shown, for example, in FIG. 8. When a clock signal is applied to the gate electrodes 45a and 45b formed in this way, a potential difference is generated in the underlying HCCD 44, to result in movement of the charges in one direction.

Figure 10A:
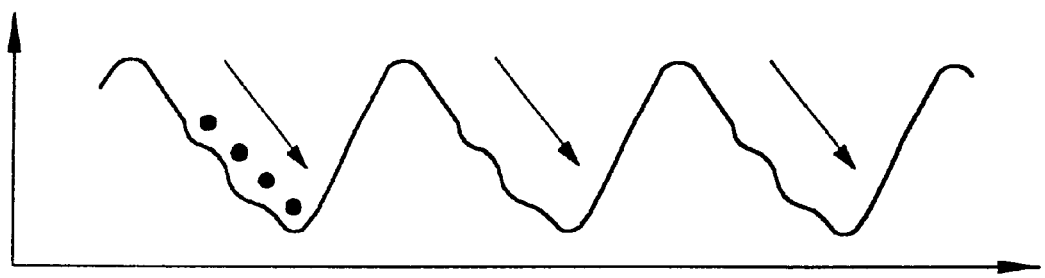
FIGS. 10A and 10B illustrate potential distributions across lines G–G' and H–H' in FIG. 8, respectively.
Figure 10B:
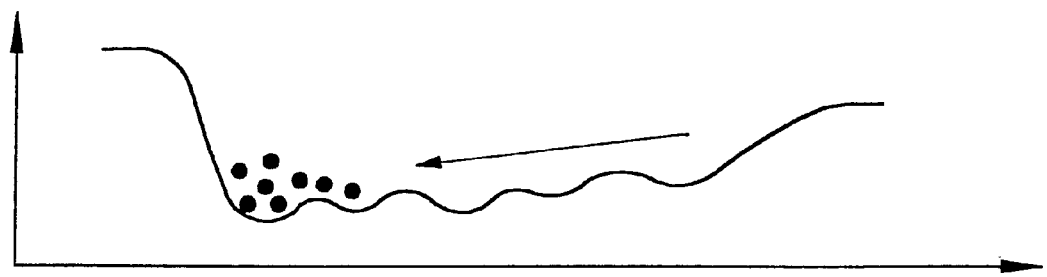
Figure 11A:
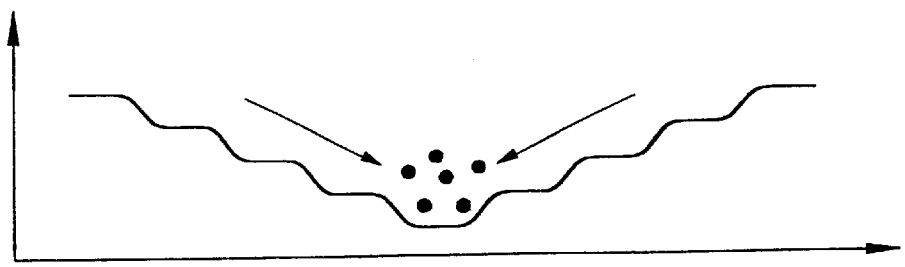
FIG. 11A illustrates a potential profile of an HCCD in a case the highest potential is on a center.
Figure 11B:
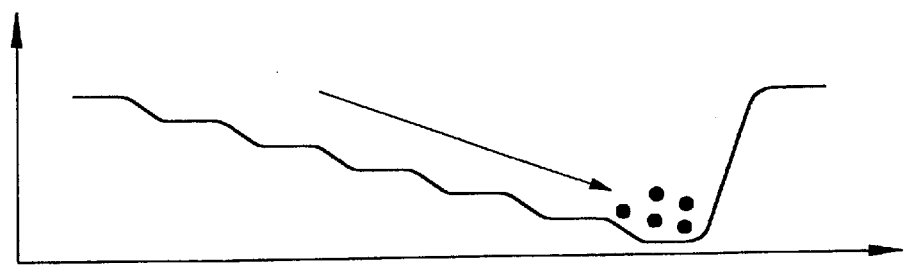
FIG. 11B illustrates a potential profile of an HCCD in a case the highest potential is far from a VCCD.
Figure 11C:
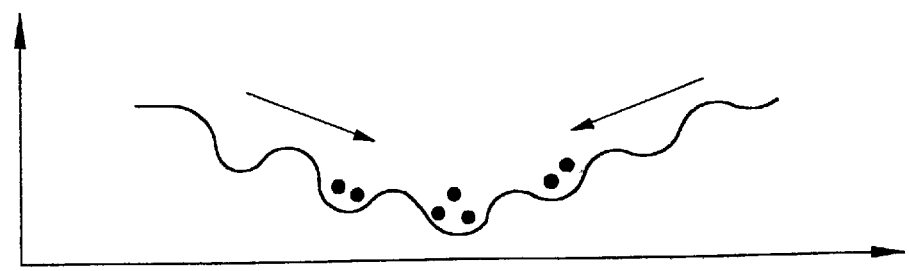
FIG. 11C illustrates another potential profile of an HCCD in a case the highest potential is on a center.

FIGS. 10A and 10B illustrate potential distributions across lines G–G' and H–H' in FIG. 8 respectively. FIG. 11A illustrates a potential profile of an HCCD in an arrangement in which the highest potential is directed towards the center of the HCCD. FIG. 11B illustrates a potential profile of an HCCD in an arrangement in which the highest potential is directed at a side of the HCCD that is opposite from the side of the HCCD adjacent to the VCCDs. FIG. 11C illustrates a potential profile of an HCCD arranged with its potential wells being separated. FIG. 10A illustrates charges moving toward a floating diffusion region caused by a potential difference between the gate electrodes 45a and 45b. FIG. 10B illustrates a state of charge movement in the HCCD 44 having the highest potential in a side of the HCCD adjacent to the VCCDs. FIG. 10B illustrates the distribution and movement of charges generated at a low illumination picture taking level, for example, not distributed throughout the HCCD 44, but instead gathered towards a portion of the HCCD 44 having the highest potential as a result of the specific arrangement of the split portions of the 'p' type well regions 43a, 43b, 43c, 43d and 43e toward the floating diffusion region.

As a result, even if the amount of the generated charge is small, there is little or no loss of the charge, because the charge is not distributed throughout the entire HCCD 44, as in prior art arrangement, but instead is focused only through a specific portion of the HCCD 44. FIG. 11A illustrates a potential profile of an HCCD 44 having an arrangement that results in the highest potential being directed towards a center of the HCCD, wherein the potential profile has a stair form. FIG. 11B illustrates a potential profile of an HCCD that is arranged so that its highest potential is directed at a position relatively far from the VCCDs, wherein the potential profile also has a stair form. FIG. 11C illustrates another potential profile of an HCCD that is arranged so that its highest potential is directed towards the center of the HCCD by adjusting the distances between the split portions of the 'p' type well region, wherein the potential wells have separated forms.

As has been explained, the charge coupled device arrangements of the present invention has the following advantages. Because the channel region of the present invention is formed, not to have a uniform potential, but instead to be able to be configured to provide different potentials between portions of the channel region by varying the arrangement of the portions of the well region, a small amount of charges generated in a case of a low illumination, for example, is transmitted, not throughout the HCCD, but instead only through a portion thereof. This arrangement results in the suppression of any charge loss. The arrangements of the instant invention result in a CCD having an increased level of charge transmission efficiency and that results in improved picture quality.

It will be apparent to those skilled in the art that various modifications and variations can be made in the charge coupled device of the present invention without departing from the spirit or scope of the invention. Thus, it is intended that the present invention cover the modifications and variations of this invention provided they come within the scope of the appended claims and their equivalents.

What is claimed is:

1. A charge coupled device comprising:
   a plurality of photoelectric conversion regions;
   a plurality of vertical charge coupled devices (VCCDs) provided between the photoelectric conversion regions for transmission of charges generated at the photoelectric conversion regions in a first direction; and
   a horizontal charge coupled device (HCCD) coupled to the VCCDs and having a channel region including a plurality of channels for transmission of the charges previously transmitted through the VCCDs in a second direction,
   wherein the plurality of channels of the channel region are arranged so that the channels having the smallest widths are situated at the center of the channel region, and so that the widths of the channels gradually get larger moving further away from the center of the channel region,
   wherein the channel region is formed such that one of the plurality of channels has a higher potential than the remaining channels, and
   wherein the remaining channels have potentials that gradually become lower than the highest potential moving further away from the channel having the highest potential, the channel region thereby transmitting the charges within the HCCD so that the charges are gathered together centered around the channel having the highest potential during transmission of the charges.

2. A device as claimed in claim 1, wherein the channel having the highest potential in the HCCD is provided at a center region of the HCCD.

3. A device as claimed in claim 1, wherein a potential difference within the HCCD is maintained in a direction that is vertical to a movement direction of the charge within the HCCD.

4. A charge coupled device comprising:
   a semiconductor substrate;

photoelectric conversion regions formed in a well region in a surface of the semiconductor substrate;

vertical charge coupled devices (VCCDS) for transmission of charges generated at the photoelectric conversion regions in a first direction; and a horizontal charge coupled device (HCCD) for transmission of the charges previously transmitted through the VCCDS in a second direction, wherein the HCCD is formed in a well region that is separated into a plurality of split portions, wherein the split portions of the well region are arranged so that split portions having the smallest widths are situated at the center of the well region, and so that the widths of the split portions gradually get larger moving further away from the center of the well region.

5. A device as claimed in claim 4, wherein the split portions of the well region are split apart from each other in a particular direction that is also a charge movement direction.

6. A device as claimed in claim 4, wherein the split portions of the well region are arranged so that they are spaced apart from each other by the largest distance near the center of the well region, and so that the distance between adjacent split portions reduces moving further away from the center of the well region.

7. A device as claimed in claim 4, wherein the potential profile of the HCCD has either a stair form or a separated potential well form in a direction vertical to a charge transmission direction depending on adjustment of the widths of respective split portions and distances between the split portions.

8. A charge coupled device comprising:

a semiconductor substrate;

photoelectric conversion regions formed in a well region in a surface of the semiconductor substrate;

vertical charge coupled devices (VCCDs) for transmission of charges generated at the photoelectric conversion regions in a first direction; and a horizontal charge coupled device (HCCD) for transmission of the charges previously transmitted through the VCCDs in a second direction, wherein the HCCD is formed in a well region that is separated into a plurality of split portions, wherein the split portions of the well region are arranged so that split portions having the smallest widths are situated at a first side of the well region that is adjacent to the VCCDs, and so that the widths of the split portions gradually get larger moving further away from the first side of the well region.

9. A device as claimed in claim 8, wherein the split portions of the well region are arranged so that they are spaced apart from each other by the largest distance near a side of the well region that is not adjacent to the VCCDs, and so that the distance between adjacent split portions decreases moving towards the VCCDs.

10. A charge coupled device comprising:

a semiconductor substrate;

photoelectric conversion regions formed in a well region in a surface of the semiconductor substrate;

vertical charge coupled devices (VCCDs) for transmission of charges generated at the photoelectric conversion regions in a first direction; and a horizontal charge coupled device (HCCD) for transmission of the charges previously transmitted through the VCCDs in a second direction, wherein the HCCD is formed in a well region that is separated into a plurality of split portions, wherein the split portions of the well region are arranged so that split portions having the largest widths are situated at a side of the well region that is not adjacent to the VCCDs, and so that the widths of the split portions gradually get smaller moving nearer to the VCCDs.

11. A device as claimed in claim 10, wherein the split portions of the well region are arranged so that they are spaced apart from each other by the smallest distance near a first side of the well region that is adjacent to the VCCDs, and so that the distance between adjacent split portions increases moving further from away the first side of the well region.

* * * * *